(12) United States Patent
Dominquez et al.

(10) Patent No.: US 7,524,765 B2
(45) Date of Patent: Apr. 28, 2009

(54) DIRECT TAILORING OF THE COMPOSITION AND DENSITY OF ALD FILMS

(75) Inventors: Juan E. Dominquez, Hillsboro, OR (US); Adrien R. Lavoie, Beaverton, OR (US); Harsono S. Simka, Saratoga, CA (US); John Plombon, Portland, OR (US); David M. Thompson, East Amherst, NY (US); John D. Peck, West Seneca, NY (US)

(73) Assignee: Intel Corporation, Santa Clara, CA (US)

( * ) Notice: Subject to any disclaimer, the term of this patent is extended or adjusted under 35 U.S.C. 154(b) by 390 days.

(21) Appl. No.: 11/266,131

(22) Filed: Nov. 2, 2005

(65) Prior Publication Data

US 2007/0099420 A1 May 3, 2007

(51) Int. Cl.
*H01L 21/44* (2006.01)
(52) U.S. Cl. ............... 438/681; 257/E21.171
(58) Field of Classification Search ............... 438/681
See application file for complete search history.

(56) References Cited

U.S. PATENT DOCUMENTS

| | | | | |
|---|---|---|---|---|
| 7,306,956 | B2* | 12/2007 | Kuse | 438/14 |
| 2004/0009307 | A1* | 1/2004 | Koh et al. | 427/569 |
| 2004/0209005 | A1* | 10/2004 | Goto et al. | 427/579 |
| 2005/0000431 | A1* | 1/2005 | Elers | 118/715 |

* cited by examiner

*Primary Examiner*—Alexander G Ghyka
(74) *Attorney, Agent, or Firm*—Blakely, Sokoloff, Taylor & Zafman LLP (57) ABSTRACT

A method comprising introducing an organometallic precursor according to a first set of conditions in the presence of a substrate; introducing the organometallic precursor according to a different second set of conditions in the presence of the substrate; and forming a layer comprising a moiety of the organometallic precursor on the substrate according to an atomic layer deposition process. A system comprising a computing device comprising a microprocessor, the microprocessor coupled to a printed circuit board, the microprocessor comprising a substrate having a plurality of circuit devices with electrical connections made to the plurality of circuit devices through interconnect structures formed in a plurality of dielectric layers formed on the substrate and each of the plurality of interconnect structures separated from the plurality of dielectric layers by a barrier layer formed according to an atomic layer deposition process.

8 Claims, 6 Drawing Sheets

DIRECT TAILORING OF THE COMPOSITION AND DENSITY OF ALD FILMS

BACKGROUND

1. Field

Integrated circuit processing.

2. Description of Related Art

Modern integrated circuits use conductive interconnections to connect the individual devices on a chip or to send and/or receive signals external to the device(s). Common types of interconnections include copper and copper alloy interconnections (lines) coupled to individual devices, including other interconnections (lines) by interconnections through vias.

A typical method of forming an interconnection, particularly a copper interconnection, is a damascene process. A typical damascene process involves forming a via and an overlying trench in a dielectric to an underlying circuit device, such as a transistor or an interconnection. The via and trench are then lined with a barrier layer of a refractory material, such as titanium nitride (TiN), tungsten nitride (WN), tantalum (Ta), or tantalum nitride (TaN). The barrier layer serves, in one aspect, to inhibit the diffusion of the interconnection material that will subsequently be introduced in the via and trench into the dielectric. Next, an adhesion layer may be formed on the barrier layer to improve the adhesion of a subsequently formed conductive interconnection to the barrier layer or the via and/or trench. Suitable materials for an adhesion layer include titanium (Ti), tantalum (Ta) and ruthenium (Ru). Next, a suitable seed material is deposited on the wall or walls of the via and trench. Suitable seed materials for the deposition of copper interconnection material include copper (Cu), nickel (Ni), cobalt (Co), and ruthenium (Ru). Next, interconnection material, such as copper, is introduced by electroplating or physical deposition in a sufficient amount to fill the via and trench and complete the interconnect structure. Once introduced, the interconnection structure may be planarized and a dielectric material (including an interlayer dielectric material) introduced over the interconnection structure to suitably isolate the structure.

Currently, barrier layer and adhesion layer formation is conducted by physical vapor deposition (PVD). Where both barrier layer and adhesion layer are formed, the formation generally requires separate tools (or separate chambers). Thus, a wafer must be removed from one chamber and placed in another chamber which adds additional complexity and contamination risks to the formation process.

In addition, as via and trench widths become smaller, the conductivity and fill ability of an interconnection may be changed. For example, PVD deposition of a barrier layer into a narrow via or trench is typically not conformal (e.g. uniform thickness of the via or trench). In addition, an overhang of the PVD-deposited material at an opening of the via or trench may pinch-off the via or trench and inhibit the ability to fill the via or trench with conductive material.

DETAILED DESCRIPTION

Figure 1:
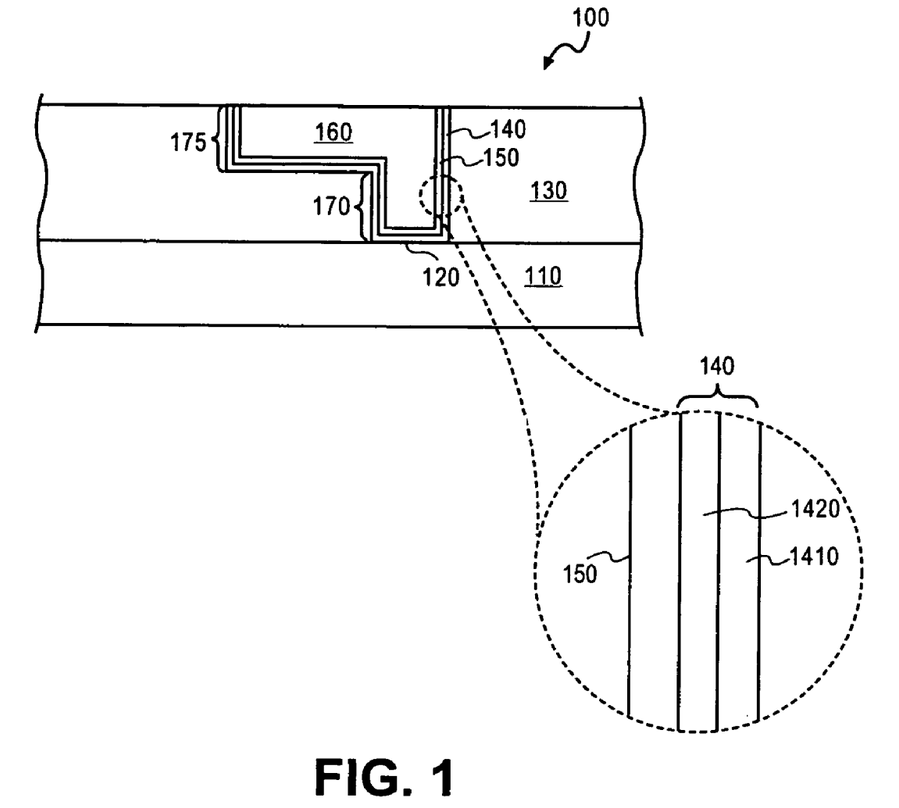
FIG. 1 shows a schematic, cross-sectional side view of an interconnect structure.

FIG. 1 shows a typical integrated circuit structure, such as a portion of a microprocessor chip on a silicon wafer. A typical integrated circuit such as a microprocessor chip may have, for example, multiple interconnection layers or levels separated from one another by interlayer dielectric material. Structure 100 includes an interconnection line over substrate 110. Substrate 110 may be the wafer substrate having circuit devices, including transistors, thereon as well as one or more levels of interconnection to devices. FIG. 1 shows contact point 120 that may be a circuit device formed on or in a wafer or an interconnection line formed above the wafer to devices on the wafer. It is to be appreciated that the techniques described herein may be used for various interconnections within an integrated circuit including to circuit devices and other interconnections. In this sense, contact point 120 represents such devices or interconnections where an interconnection contact is made.

FIG. 1 illustrates a cross-sectional side view of a portion of a substrate. Overlying substrate 110 is dielectric material 130. Dielectric material 130 is, for example, silicon dioxide ($SiO_2$) formed by a tetraethyl orthosilicate (TEOS) or a plasma enhanced chemical vapor deposition (PECVD) source. Dielectric material 130 may also be a material having, for example, a dielectric constant (k) less than the dielectric constant of $SiO_2$ (e.g., a "low k" material), including polymers as known in the art.

FIG. 1 shows via 170 through dielectric material 130 to expose contact point 120. FIG. 1 also shows trench 175 formed in a portion of dielectric material 130 over via 170. A trench and via may be formed according to known techniques by, for example, initially using a mask, such as a photoresist mask, to define an area (e.g., a cross-sectional area) for a via opening and etching the via with a suitable chemistry, such as, for example, a $CH_3F/CF_4$ or $C_4F_8$ etch chemistry for $SiO_2$. The mask may then be removed (such as by an oxygen plasma to remove photoresist) and a second mask patterned to define, for example, a greater area (e.g., a greater cross-sectional area) for a trench opening. A subsequent mask and etch is introduced to form a trench and the second mask is removed leaving the substrate shown in FIG. 1.

FIG. 1 also shows the substrate having first material 140 formed along the side walls of the via and trench opening. In one embodiment, first material 140 is deposited to a thickness of approximately 0.5 to 25 nanometers (nm) depending on the desired characteristics of the material. A specific deposition process employing atomic layer deposition processing is described in detail below. First material 140 may be a single layer or a composite material of a number of layers including, in one embodiment, barrier layer 1410 (see inset) to be effective to inhibit interconnect material diffusion, such as copper diffusion into dielectric material 130. Barrier layer 1410 may also be chosen for its adhering properties to dielectric material 130. Suitable materials for barrier layer 1410 include tantalum (Ta), tantalum nitride (TaN), tantalum silicon nitride (TaSiN), tungsten (W), tungsten nitride (WN), tungsten silicon nitride (WSiN), titanium (Ti), titanium nitride (TiN), titanium silicon nitride (TiSiN), and cobalt (Co).

Separated from dielectric material 130 by barrier layer 1410 may be adhesion layer 1420 as part of composite layers that make up first material 140 (see FIG. 1, inset). Adhesion layer 1420 may be chosen for its property to adhere to barrier layer 1410 and/or its property to promote the adhesion of an interconnection material subsequently introduced in via 170 and/or trench 175. Representatively, transition metals such as tantalum and titanium are suitable materials for adhesion layer 1420, particularly where an underlying barrier layer (e.g., barrier layer 1410) includes similar elements.

Referring to FIG. 1, overlying first material 140 as a blanket including along the side walls and bottom of via 170 and trench 175 is second material 150. Second material 150 is used, in one sense, in connection with a subsequent electroplating process to form an interconnection in via 170 and trench 175. While first material 140 may be a conductive material such as a tantalum compound that may be capable of carrying a current utilized in an electroplating process, first material 140 may also not be a good conductor and may cause non-uniform current flow which, in turn, may adversely affect the electroplating process and the reliability of the interconnection. Second material 150, on the other hand, generally provides uniform current flow during electroplating and, in one sense, serves as a seed material for electroplating the interconnection. Moreover, second material 150 may be selected to provide enhanced adhesion of the subsequently formed interconnection to the substrate.

In one embodiment, second material 150 is, for example, a copper material introduced using chemical or physical deposition techniques. A thickness of second material 150 along the side walls and bottom of via 170 and trench 175 of less than 3,000 angstroms (Å) is suitable.

FIG. 1 shows structure 100 after filling via 170 and trench 175 with interconnection material 160 of, for example, a copper material. The typical introduction technique for a copper interconnection material as noted above is an electroplating process. By way of example, a typical electroplating process involves introducing a substrate (e.g., a wafer) into an aqueous solution containing metal ions, such as copper sulfate-based solution, and reducing the ions (reducing the oxidation number) to a metallic state by applying current between substrate with second material 150 and an anode of an electroplating cell in the presence of the solution. Copper metal is deposited on to second material 150 to fill via 170 and trench 175 and form copper interconnection material 160.

In one embodiment, interconnection material 160 and or second material 150 is copper or a copper alloy. Suitable copper alloys include copper tin (CuSn), copper-aluminum (CuAl), copper-indium (CuIn), copper-cadmium (CuCd), copper-zinc (CuZn), copper-bismuth (CuBi), copper-ruthenium (CuRu), copper-rhodium (CuRh), copper-rhenium (CuRe), copper-tungsten (CuW), copper-cobalt (CuCo), copper-palladium (CuPd), copper-gold (CuAu), copper-platinum (CuPt), and copper-silver (CuAg). Alloys are generally formed by one of two methods. Typically, copper-tin, copper-aluminum, copper-indium, copper-cadmium, copper-bismuth, copper-ruthenium, copper-rhenium, copper-rhodium, and copper-tungsten are electroplated. Alternatively, copper may be doped with catalytic metals such as silver, platinum, tin, rhodium, and ruthenium by introducing a contact displacement layer on top of planarized copper interconnection material (see next paragraph) and applying a thermal anneal to form an alloy.

Structure 100 may be planarized such as by a chemical-mechanical polish as known in the art to dielectric material 130 to remove first material 140, second material 150, and any interconnection material 160 present on the upper surface of dielectric material 130. FIG. 1 shows structure 100 having interconnect material 160, second material 150 and first material 140 introduced into via 170 and trench 175 with the surface of dielectric material 130 and the interconnect structure planarized.

Referring again to first material 140, in one embodiment, first material 140 is formed according to an atomic layer deposition (ALD) process. Generally speaking, an atomic layer deposition process involves forming a film layer-by-layer by exposing a surface to alternating pulses of reactants, each of which undergoes a self-limiting reaction, generally resulting in controlled film deposition. An advantage to using an ALD process in forming a barrier layer between a dielectric and a conductor (such as a barrier between a dielectric and an interconnect) is the barrier layer may be uniform, continuous and conformal.

In one embodiment, first material 140 includes a barrier layer (e.g., barrier layer 1410) and an adhesion layer (adhesion layer 1420) each formed by an ALD process involving introducing an organometallic precursor in the presence of a substrate. Although FIG. 1 shows discrete layers for barrier layer 1410 and adhesion layer 1420, the layers or films may be present as an integrated liner layer comprising both barrier and adhesive properties with or without a discrete interface.

To form an integrated liner layer or a barrier layer or adhesive layer, an organometallic precursor may be introduced from families, such as, but not limited to, imines, amines, cyclic arenes, carbenes, halides, carbonyls, alkenes and transition and other metal centers such as, but not limited to, tantalum (Ta), titanium (Ti), tungsten (W), copper (Cu), ruthenium (Ru), molybdenum (Mo), iridium (Ir), platinum (Pt), and palladium (Pd) and other refractory metal compounds from D-block elements including groups 3-11 in the Periodic Table of the Elements. The organometallic precursor may have one or more metal centers. Specific examples of single metal center organometallic precursors that have ruthenium (Ru), as the single metal center include the cyclopentadienyl compounds Cp'RuRCO$_2$ (where Cp' is a cyclopentadienyl ring, a functionalized cyclopentadienyl ring, or any 6-electron donating dienyl ring and R is any anionic 2-electron donor), Cp'$_2$RuR (where Cp' is a cyclopentadienyl ring, a functionalized cyclopentadienyl ring, or any 6-electron donating dienyl ring that may or may not include heteroatoms, and R is any anionic 2-electron donor), Cp'$_2$Ru (where Cp' is a cyclopentadienyl ring, or any 6-electron donating dienyl anion that may or may not include heteroatoms), specific examples of which include (Me$_2$Cp)$_2$Ru, (EtCp)(MeCp)Ru, (EtCp)(2,4-dimethylpentadienyl)Ru, (boratabenzene)Cp)Ru, and (pyrrolyl)(EtCp)Ru, Cp'Ru(arene)R (where Cp' is a cyclopentadienyl ring, a functionalized cyclopentadienyl ring, or any 6-electron donating dienyl ring that may or may not include heteroatoms, where R is any anionic 2-electron donor ligand, and where arene is a neutral cyclic 6-electron donor, such as benzene or p-cymene), [areneRu(OH$_2$)$_3$]$_2$R (where arene is a neutral cyclic 6-electron donor, such as benzene or p-cymene, and R is any anionic 2-electron donor), {COD}Ru(benzene) and other complexes where COD is replaced by a ligand participating as a 4-electron conjugated or unconjugated donor and benzene is replaced by any 6-electron donor, the carbonyl compounds Ru$_3$(CO)$_{12}$, Ru(CO)$_2$ (thd), Ru (CO)$_5$, (acrylonitrile)Ru(CO)$_4$, (C$_4$H$_4$)Ru(CO)$_4$, (butene)Ru(CO)$_3$, (allyl) $_2$TaRu(CO)$_2$, (COD)$_2$Ru(CO), and other compounds such as Ru(C$_7$H$_9$)$_2$, RuO$_2$, RuO$_4$, {COD}Ru(allyl)$_2$, Ru(acac)$_3$, Ru(thd)$_3$, (norbornene)Ru(allyl)$_2$, (norbornene) Ru(cycloheptenyl), L(PR$_3$)Cl$_2$Ru=CHY, and (L$_2$)(CO)RuCl(C$^-$Ph) (where L is any two electron and neutral donor ligand). Specific examples of multiple metal center organometallic precursors, in which at least one of the metal centers is Ru include [Cp'Ru(CO)$_2$]$_2$ (where Cp' is cyclopentadienyl, a functionalized cyclopentadienyl ligand or any 6-electron donating dienyl ring that may or may not include heteroatoms, {(arene)RuX$_2$}$_2$ where arene is a neutral 6-electron donor such as benzene or p-cymene, and X is a halide, such as Cl, or a pseudohalide, such as CN$^-$). Specific examples of single metal center organometallic precursors that have tantalum (Ta), as the single metal center include the cyclopentadienyl compounds Cp$_2$TaH$_3$; CpTa(CO)$_4$; (MeCp)Ta(CO)$_4$; CpTa(CO)$_3$(R), where R is PPh$_3$, AsPh$_3$, or any other neutral 2 electron donor; CpTa(CO)$_3$(R), where R is THF, PPh$_3$, PCy$_3$, or any other neutral 2 electron donor; CpTa(CO)$_2$(C$_5$H$_5$); Cp$_2$TaH(CO); Cp$_2$TaR(CO), where R is Me, CH$_2$Ph, Ph, or any other negatively charged 2 electron donor; Cp$_2$TaH(CH$_2$=CHR'), where R' is H, Me, Et, Pr, or Ph; Cp$_2$Ta(CH$_2$CH$_2$R')(CNR), Where R and R' are each independently chosen from H, Me, Et, Pr, Ph, or any other negatively charged 2 electron donor; CpTaXMe(CHCMe$_3$), where X is Cl, Me, or any other negatively charged 2 electron donor; Cp'TaX(CH$_2$Ph)(CHPh), where Cp' is C$_5$H$_4$Me, C$_5$Me$_5$, or any other functionalized cyclopentadienyl ligand, and where X is Cl, CH$_2$Ph, or any other negatively charged 2 electron donor; Cp*Ta(PMe$_3$)(C$_2$H$_4$)(CHCMe$_3$); Cp$_2$TaMe(CH$_2$); Cp(MeCp)TaMe(CH$_2$); Cp$_2$TaMe(CHR), where R is H, Me, Ph, SiMe$_3$, or any other negatively charged 2 electron donor; Cp$_2$Ta(CHPh$_2$)(CHCMe$_3$); Cp$_2$Ta(CH$_2$Ph)(CHPh); Cp*TaMe$_3$Ph; Cp*TaMe$_2$(Me$_2$CO); Cp*TaMe$_2$(C$_2$H$_4$); Cp$_2$TaMe$_3$; Cp$_2$TaPh$_2$; Cp*TaMe$_4$; Cp$_2$Ta(Cp)$_2$; Cp'Me$_2$Ta (indenyl); Cp$_2$TaH(CH$_2$=CHR), where R is Me, Et, nPr, or any other negatively charged 2 electron donor; Cp$_2$Ta(cyclopentene); Cp$_2$Ta(benzyl)(CHPh); Cp$_2$ClTaCH(tBu); CpTa(CH(tBu)X(PMe$_3$)$_2$, where X is H, Me, Et, Pr, halide, or Ph; Cp$_2$TaMe(C$_2$H$_4$); CH$_2$=Ta(Cp)$_2$CH$_3$; Cp$_2$Ta(nPr)(C$_8$H$_8$); CpTa(CO)$_x$(PhCCPh), where x equals 1 or 2; Cp$_2$Ta(allyl); Cp$_2$Ta(methallyl); Cp'TaH$_3$; Cp$_2$TaH(CO); Cp$_2$TaH(propene); Cp$_2$TaMe$_3$; Cp*TaCO$_4$; Cp*TaMe$_4$; Cp$_2$Ta(nPr)(CNMe); Cp*TaMe$_2$(benzene); Cp*Ta(CHCMe$_3$)(ethene)PMe$_3$; Ta(CO)$_3$(C$_7$H$_7$); Ta$_2$(CO)$_{12}$; $_{TaH(CO)2}$(Dmpe)$_2$; TaX(CO)$_2$[Me$_2$P(CH$_2$)$_2$PR$_2$]$_2$, where X is Cl, I, or any other negatively charged 2 electron donor and R is Et, iPr, or any other negatively charged 2 electron donor; (RHg)Ta(CO)$_4$, where R is Et, Ph, or any other negatively charged 2 electron donor; Ph$_3$SnTa(CO)$_4$; [(C$_5$H$_4$nBu)Ta(CO)$_3${Si(Cl$_8$H$_{37}$)$_2$}]$_2$; ((CH$_3$)$_3$CCH$_2$)$_3$Ta=CHC(CH$_3$)$_3$; ((R$_{1a}$CR$_{2a}$R$_{3a}$)((R$_{1b}$CR$_{2b}$R$_{3b}$) ((R$_{1c}$CR$_{2c}$R$_{3c}$)Ta=CR$_4$R$_5$ where R$_n$ is H, Me, Et, iPr, nPr, tBu, sBu, iBu, nBu, amyl, F, Cl, Br, I, or any other negatively charged 2-electron donor; Ta(allyl)$_4$; Ta(1-methylallyl)(C$_4$H$_6$)$_2$; and TaMe$_5$.) and other Ta single metal center organometallic compounds such as complexes of the type: TaXR$_4$, TaX$_2$R$_3$, TaX$_3$R$_2$, TaX$_4$R including metallacyclic compounds where X is a halide, such as Cl, or pseudohalide, such as CN$^-$, and R is a negatively charged 2-electron donor, such as a methyl group.

An ALD process may also employ a co-reactant(s) such as, but not limited to, hydrogen (H$_2$), ammonia (NH$_3$), hydrazine (H$_4$N$_2$) borane adducts (e.g., B$_2$H$_6$, THF-BH$_3$, a Lewis base pair of BR$_3$ and NR$_3$ with R equal to a one electron donor), primary, secondary, and tertiary amines (NR$_3$, where R is any alkyl, halide or H substituent), silanes (SiH$_4$, HSiR$_3$, H$_2$SiR$_2$, and H$_3$SiR, where R is any alkyl or halide) and methane (CH$_4$). In a representative embodiment, a film formation cycle may consist of two pulses, one for the organometallic precursor and a second pulse for the co-reactant, with a purge of the reaction chamber between pulses. Representatively, in the first pulse, the organometallic precursor fully reacts with the substrate and is self limiting in that there is a limited number of reaction sites on the substrate for the precursor to react. Next, the co-reactant is pulsed and exposed to the surface of the substrate now including precursor moieties. The co-reactant reacts with the precursor moieties to form a single atomic layer directly bonded to the substrate. This reaction is also self-limiting in that there are a limited number of precursor ligands on the substrate available for reaction. In one embodiment, a plasma source of an activated gas is introduced during the precursor pulse, the co-reactant pulse, or both. The conditions by which each of the precursor, co-reactant and optional plasma source are introduced to form an atomic layer is an example of a set of conditions. The self-limiting nature of the precursor and co-reactant provides improved conformality of a formed film compared to physical vapor deposition techniques. The self-limiting nature and layer by layer build-up also minimizes or eliminates overhang in narrow width vias and/or trenches. While the self-limiting process is important in keeping the films conformal, there may also be some film growth in locations where there is no predefined reaction site through pyrolysis. As long as the rate of growth at the predefined reaction sites is substantially higher than the rate of growth elsewhere, this contribution may be minimal and conformal films may still be generated.

Figure 2:
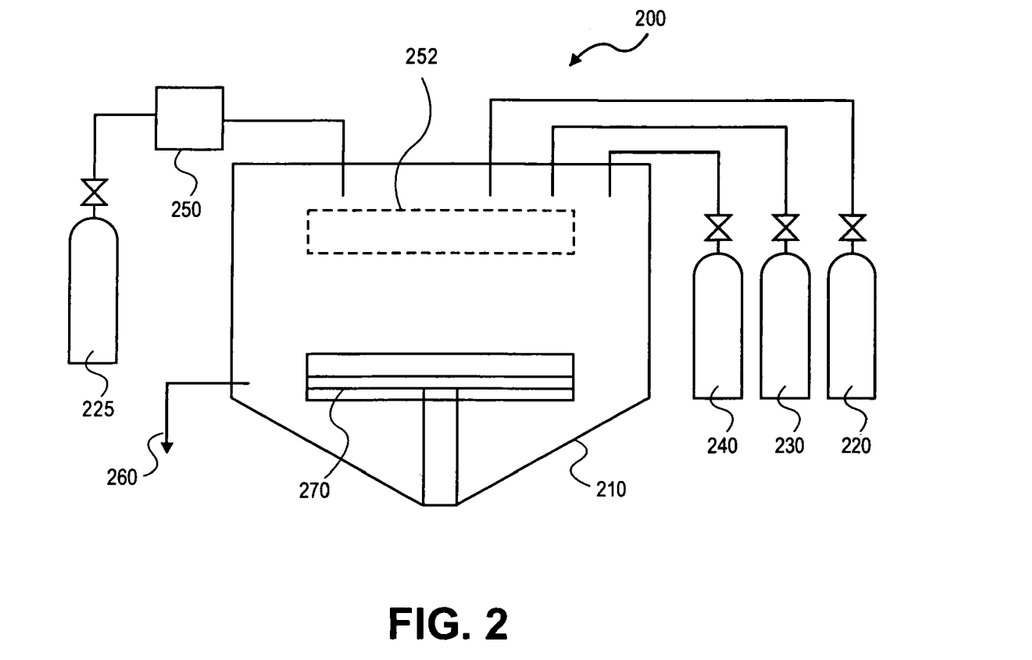
FIG. 2 shows a schematic side view of a chamber suitable for atomic layer deposition processing.

FIG. 2 shows a schematic of a representative system for forming an ALD layer such as a barrier layer on a substrate. System 200 includes chamber 210 having an interior volume suitable to accommodate a substrate, such as a semiconductor wafer. Connected to an interior volume of chamber 210 are a number of process gas sources, including gas source 220 that delivers, for example, an organometallic precursor; gas source 230 that delivers, for example, a co-reactant; and gas source 240 of a purge or other gas source. Also connected to chamber 210 is plasma activator 250 and/or plasma activator 252. Remote plasma activator 250 is separate from and communicates with chamber 210 while plasma activator 252 may be operated directly in chamber 210 (e.g., a capacitively coupled plasma electrode). In one example, a plasma activator such as remote plasma activator 250 and/or plasma activator 252 includes a plasma or ionization source for activating gas source 225, such as a hydrogen or other gas source(s) for introduction of the activated species into chamber 210 (plasma source to include ions, electrons, protons and radicals of the activated gas). The plasma source may be described in terms of energy density related to factors such as an energy applied to the gas source at the plasma activator (e.g., to establish a concentration of activated species in the plasma source) and the distance of plasma activator from a substrate surface in chamber 210. Energy density is one variable associated with a plasma source. Other variables include the duration or exposure time of the substrate (or reactants) to the plasma source and when a plasma source is introduced. In one embodiment, the plasma source may be introduced during more than one of the pulses of an ALD process (e.g., during the purge pulse, co-reactant pulse or both).

System 200 also includes an example of a temperature source (shown as temperature source 270) that may be used to heat an interior of chamber 210 to a desired temperature for a reaction between the substrate and the precursor or precursor and co-reactant. FIG. 2 shows temperature source 270 disposed within chamber 210 (in this case, within a stage within the chamber). It is appreciated that a suitable reactor may include hotwall or coldwall chambers. FIG. 2 also shows evacuation source 260 connected to an interior chamber 210 to evacuate reactive species or process gases from the chamber. Evacuation source 260 may be connected to a vacuum pump or other source.

Figure 3:
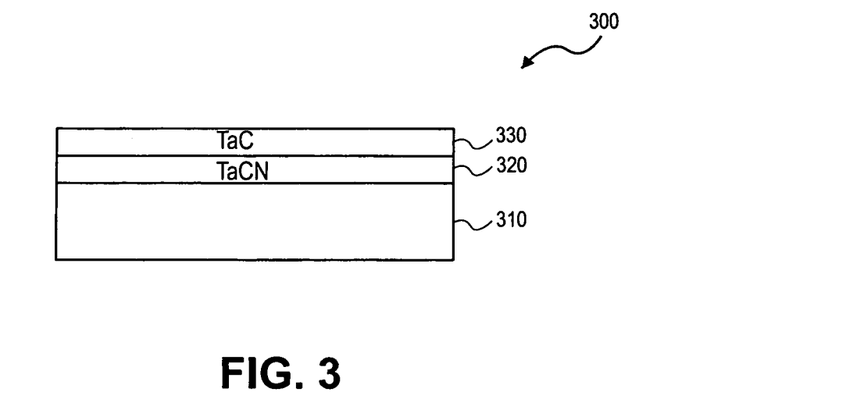
FIG. 3 shows a schematic, side view of a substrate having two films (two layers) formed thereon.

FIG. 3 shows substrate 310 with film or layer 320 formed on a surface thereof. Film 320 is, for example, a tantalum, carbon and nitrogen containing film, hereinafter referred to as TaCN. Overlying a surface (top surface as viewed) of film 320 is film 330 of a tantalum and carbon containing film, hereinafter referred to as tantalum and carbon containing film. One way to form film 320 and film 330 having different material properties is by modifying the set of conditions by which the films are formed in a single chamber. For example, the plasma source to form film 320 may be different from the plasma source to form film 330. To form film 320 and film 330 using an ALD process in a chamber such as the chamber described with reference to FIG. 2, the following conditions may be employed: film 320 deposited with 75 cycles of tantalum precursor (e.g., a tantalum cyclopentadienyl compound) plus a plasma generated from a $H_2$ and $N_2$ gaseous mixture; film 330 deposited with 75 cycles of tantalum precursor and $H_2$ plasma. Both film 320 and film 330 may be formed at a chamber temperature 330° C.

Figure 4:
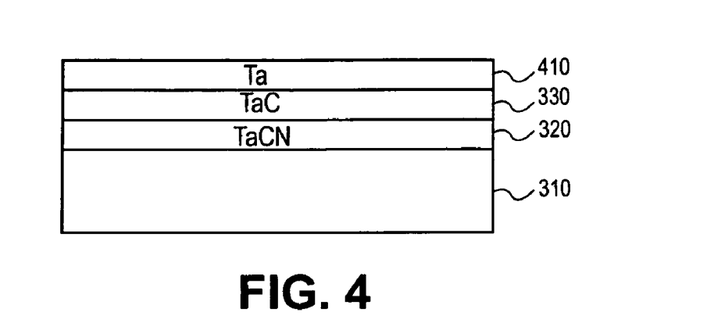
FIG. 4 shows a schematic side view of a substrate having three films (three layers) formed thereon.

FIG. 3 demonstrates that by modifying the concentration or presence of species in an ALD process, the reaction product may be modified to suit a desired film composition or density profile. In one aspect, a graded film may be formed of multiple film properties (e.g., electrical, diffusive, adhesive, etc.) with stoichiometric differences across the film with or without a distinct interface. For example, in FIG. 3, it is appreciated that there may not be a discrete interface between film 320 and film 330. In another example of film grading, a metallic property of a reaction product may be modified. For example, increasing the concentration or energy (via plasma power) of the hydrogen plasma source in the example described with reference to FIG. 3 tends to reduce the presence of particular elements in the metal film (such as C, N, O, Si, B). Thus, FIG. 4 shows the structure of FIG. 3 following the formation of film 410 of a tantalum metal material. Relative to a metal compound such as TaN, tantalum as a metal has improved adhesion characteristics to another metal, such as a seed layer or interconnect layer that might be introduced on the composite structure shown in FIG. 4. Thus, referring to FIG. 1, it is seen that first material 140 may be formed using an ALD process whereby barrier layer 1410 (e.g., film 320 and/or film 330 in FIG. 4) may be formed followed by the formation of adhesion layer 1420 (film 410 in FIG. 4) in the same chamber with modifications to the process parameters.

Figure 5:
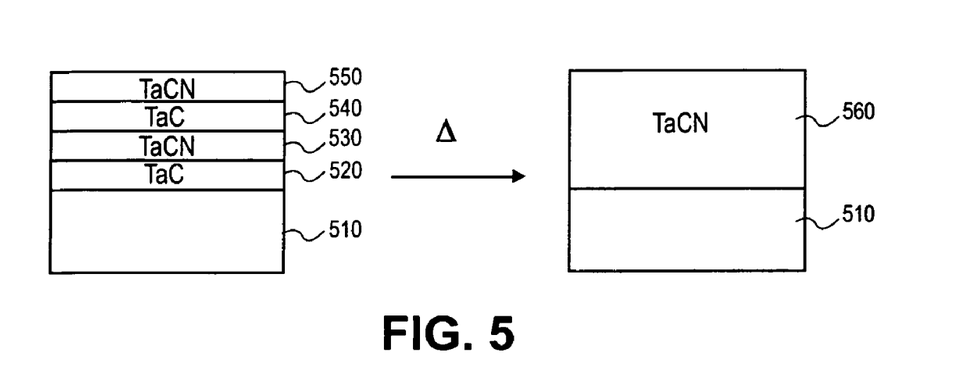
FIG. 5 shows a schematic side view of a substrate having four films (four layers) formed thereon and conversion of the four films into a compositionally uniform film using an annealing process.

In another example, in addition to modifying the concentration of reactant species and plasma power in an ALD process to form films or layers, the temperature of a reaction may be modified to modify a film after a film is formed. For example, FIG. 5 shows substrate 510 having a composite film or laminate thereon. In one embodiment, the laminates include film 520 of a tantalum and carbon containing film (TaC), film 530 of TaCN, film 540 of a tantalum and carbon containing film (TaC), and film 550 of TaCN. In one embodiment, annealing the laminate, either alone or in the presence of a plasma source, may serve to form a uniform film of the laminates. In another embodiment, depending on the temperature used, the laminate layer can form segregated layers at the bottom and/or top interfaces. FIG. 5 shows film 560 of a uniform film of TaCN formed by the anneal (at temperatures ranging from 300° C. to 400° C.). In one embodiment, a deposition temperature may be alternated to enhance, for example, a ligand reaction with a co-reactant or a reactant species for removal after purging. For example, a deposition temperature of 300° C. can be used during the precursor pulse with no co-reactant, whereas a 320° C. temperature may be used for reaction with a co-reactant with or without a plasma source.

Figure 6:
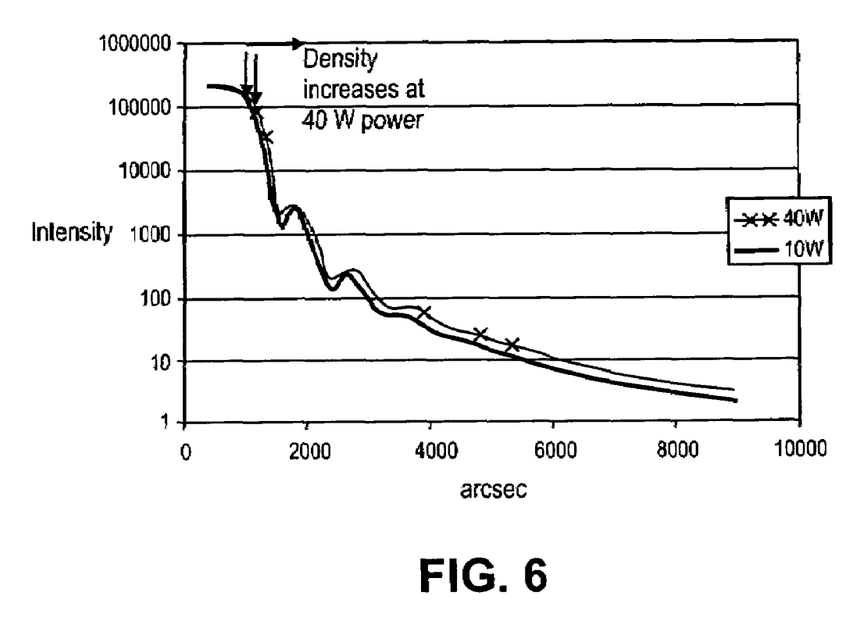
FIG. 6 shows an x-ray reflection spectrum of two ALD films formed using different plasma densities.

In another embodiment, the process condition of an ALD process may be controlled in such a way to control a film density of a formed film. FIG. 6 shows an x-ray reflection (XRR) spectrum of two tantalum and carbon containing films formed with similar thicknesses that were deposited using similar conditions (e.g., temperatures, cycle times, total time, precursors). In this example, the difference in the deposition of the two films involves the plasma power density. One film was deposited using a plasma power density of 0.22 Watts per square centimeter ($W/cm^2$) and a second film was deposited using a plasma power density of 0.89 $W/cm^2$. A change in density can be seen by the change in critical angle (with critical angle increasing with increasing density) of the scans. A fitted tantalum and carbon containing film density is 38 percent of bulk when using 0.22 $W/cm^2$ and increases to the 52 percent of tantalum and carbon containing film as the plasma power increases to 0.89 $W/cm^2$. Thus, in this example, an increase in plasma power density from 0.22 $W/cm^2$ to 0.89 $W/cm^2$ results in a film density increase of about 35 to 40 percent.

Figure 7:
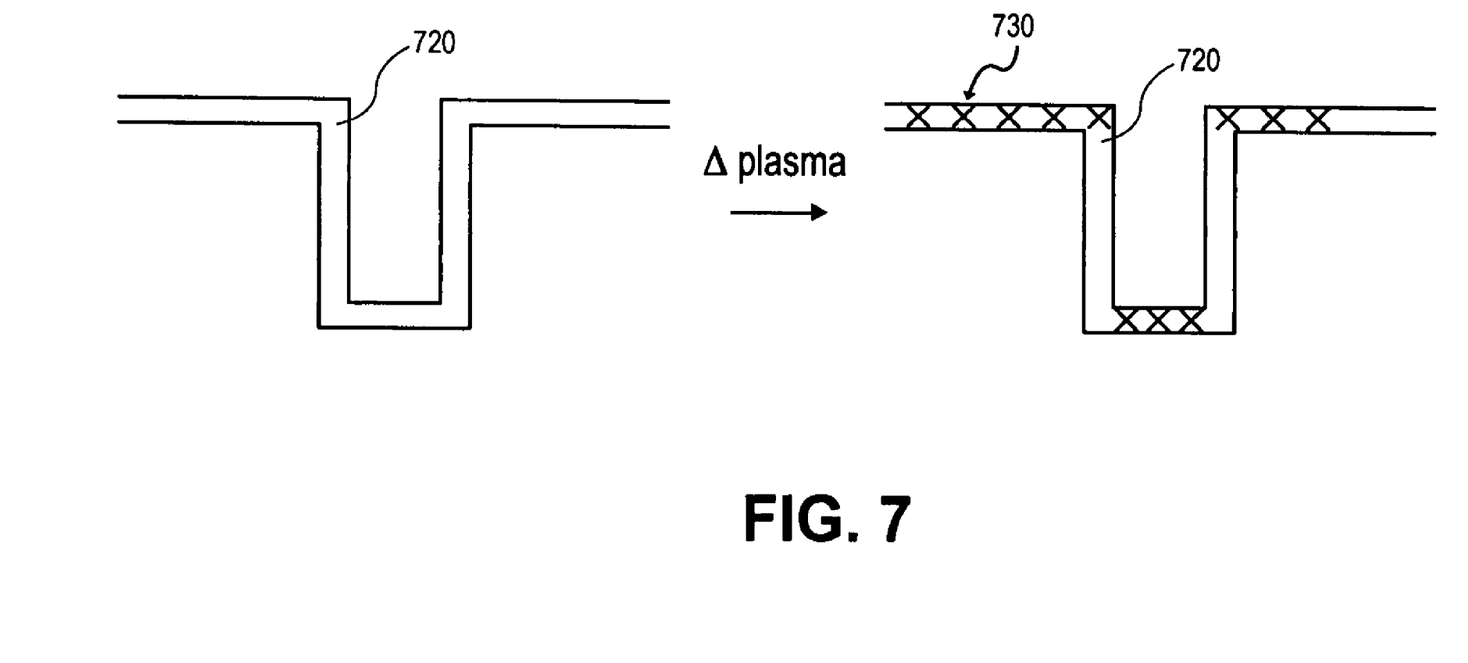
FIG. 7 shows a schematic, cross-sectional side view of a film formed on a substrate and modification of a portion of that film with increased plasma power.

In another embodiment, ALD processing may be used to form a film whose properties can be tailored on the basis of film density. For example, film density controls electrical properties (e.g., conductivity, dielectric constant, barriers to diffusion, etc.). Film density may also be used to modify patterning properties (etching, etc.). For example, FIG. 7 shows film 720 formed on a substrate, such as in a via opening to a contact point and overlying a dielectric material (horizontally overlying as viewed). FIG. 7 also shows that increasing the plasma on portions of film 720 changes the properties of film 720. For example, increasing a plasma power density in the range of 0.1 to 1.0 $W/cm^2$ may give directionality to a film deposit. In this case, increasing a density of horizontal portions 730 of film 720. In this way, the electrical properties of portions 730 may be increased and/or the patterning properties of portion 730 may be modified. In the latter case, patterning properties of portions 730 of film 720 may be modified so that it may be more easily removed in the presence of a particular etchant than portions of film 720.

Figure 8:
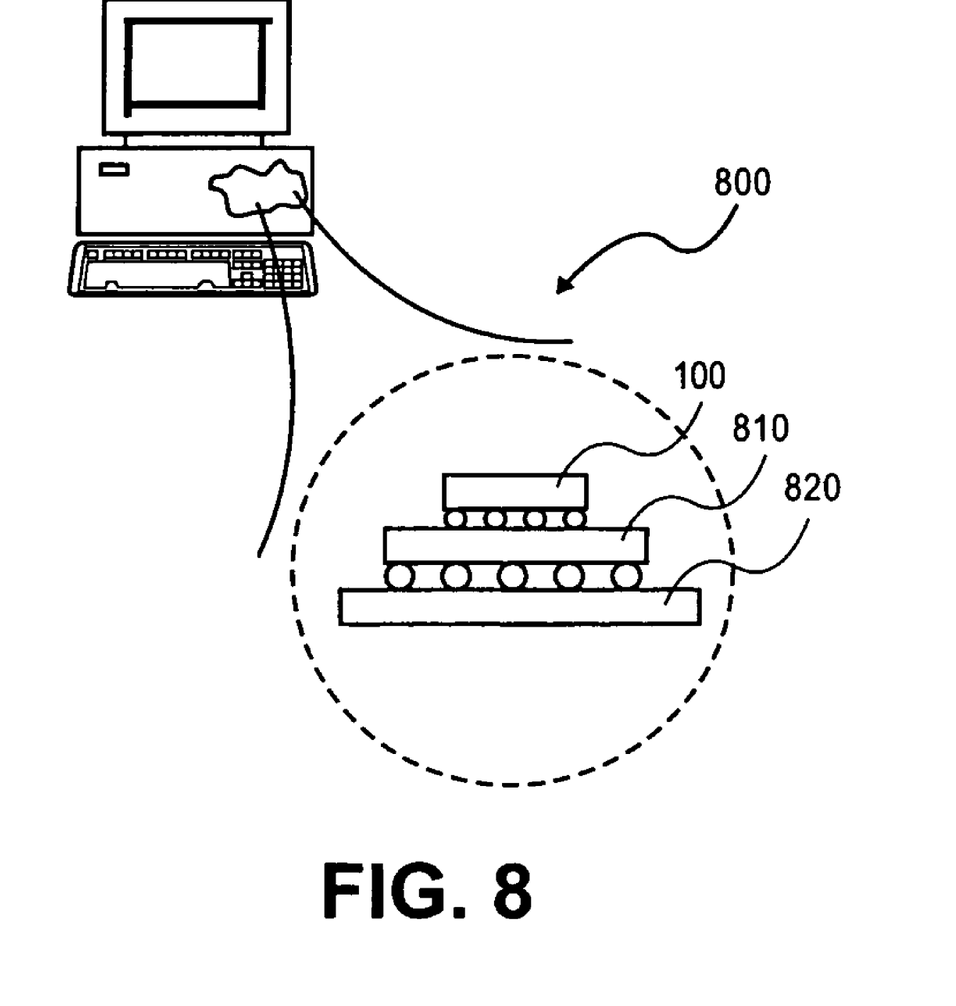
FIG. 8 shows a computer system including a microprocessor having interconnect lines formed according to techniques described with reference to FIGS. 1-7.

FIG. 8 shows a cross-sectional side view of an integrated circuit package that can be physically and electrically connected to a printed wiring board or printed circuit board (PCB) to form an electronic assembly. The electronic assembly can be part of an electronic system such as a computer (e.g., desktop, laptop, handheld, server, etc.), wireless communication device (e.g., cellular phone, cordless phone, pager, etc.), computer-related peripheral (e.g., printer, scanner, monitor, etc.), entertainment device (e.g., television, radio, stereo, tape and compact disc player, video cassette recorder, MP3 (motion picture experts group, audio layer 3 player, etc.), and the like. FIG. 8 illustrates the package is part of a desktop computer. FIG. 8 shows electronic assembly 800 including die 100 (see FIG. 1 and the accompanying text) physically and electrically connected to package substrate 810. Die 100 is an integrated circuit die, such as a microprocessor die having, for example, transistor structures interconnected or connected to power/ground or input/output signals external to the die through interconnect lines formed as described with reference to FIGS. 1-7. Electrical contact points (e.g., contact pads on a surface of die 100) are connected to package substrate 810 through, for example, a conductive bump layer. Package substrate 810 may be used to connect die 100 to printed circuit board 820, such as a motherboard or other circuit board.

Various aspects of ALD processing are described. These aspects include modulating ALD film properties through plasma type and power modulation. Certain aspects are described in relation to forming liner layers such as barriers and/or adhesion layers useful in the formation of interconnect structures. Other applications include various areas where barrier layers might be used such as front end metal gate barriers and other semiconductor applications.

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:

1. A method comprising:
    introducing an organometallic precursor and a first co-reactant according to a first set of conditions for an atomic layer deposition process in the presence of a substrate;
    introducing the organometallic precursor and a second co-reactant according to a different second set of conditions for an atomic layer deposition process in the presence of the substrate;
    introducing a plasma source; and
    forming a layer comprising a moiety of the organometallic precursor on the substrate according to an atomic layer deposition process,
    wherein a difference between the first set of conditions and the second conditions comprises a variable related to at least one of the first or second co-reactant and the plasma source.

2. The method of claim 1, wherein a difference between the first set of conditions and the second set of conditions comprises a variable related to the plasma source.

3. The method of claim 2 wherein an energy density of the plasma source according to the second set of conditions is different than an energy density of the plasma source according to the first set of conditions.

4. The method of claim 1, wherein forming comprises forming a graded film.

5. The method of claim 1, wherein a difference between the first set of conditions and the second set of conditions comprises a variable related to the co-reactant.

6. The method of claim 5, wherein the first co-reactant and the second co-reactant are different.

7. The method of claim 1, wherein forming comprises:
    forming a first layer according to the first set of conditions and forming a second layer according to the second set of conditions, wherein the second layer comprises a material property different than a material property of the first layer.

8. A method comprising:
    introducing an organometallic precursor according to a first set of conditions for an atomic layer deposition process in the presence of a substrate;
    introducing the organometallic precursor according to a different second set of conditions for an atomic layer deposition process in the presence of the substrate; and
    forming a barrier layer and an adhesion layer comprising a moiety of the organometallic precursor on the substrate according to an atomic layer deposition process,
    wherein the first set of conditions comprises a first temperature and the second set of conditions comprises a different temperature.

\* \* \* \* \*